(12) United States Patent
Fukaishi

(10) Patent No.: US 6,314,151 B1
(45) Date of Patent: Nov. 6, 2001

(54) PHASE COMPARATOR OPERABLE AT HALF FREQUENCY OF INPUT SIGNAL

(75) Inventor: Muneo Fukaishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/167,733

(22) Filed: Oct. 7, 1998

(30) Foreign Application Priority Data

Oct. 8, 1997 (JP) .................................................. 9-274905

(51) Int. Cl.⁷ ...................................................... H04D 3/24
(52) U.S. Cl. ........................... 375/376; 327/159; 331/1 A
(58) Field of Search ................................... 375/354, 371, 375/373, 376; 327/12, 147, 148, 150, 156, 157, 159; 331/1 A; 370/503, 516

(56) References Cited

U.S. PATENT DOCUMENTS

| | | | |
|---|---|---|---|
| 5,027,085 | * 6/1991 | DeVito | 331/1 A |
| 5,050,193 | * 9/1991 | Ponsard | 375/357 |
| 5,115,208 | * 5/1992 | Masdea et al. | 331/1 A |
| 5,619,171 | * 4/1997 | Rijckaert et al. | 331/1 A |
| 5,703,511 | * 12/1997 | Okamoto | 327/157 |
| 5,994,932 | * 11/1999 | Ando | 327/156 |
| 6,064,236 | * 6/2000 | Kuwata et al. | 327/12 |

FOREIGN PATENT DOCUMENTS

| | | |
|---|---|---|
| 61-43819 | 3/1986 | (JP) . |
| 62-36937 | 2/1987 | (JP) . |
| 62-183216 | 8/1987 | (JP) . |
| 63-111724 | 5/1988 | (JP) . |
| 63-131633 | 6/1988 | (JP) . |
| 2-3137 | 1/1990 | (JP) . |
| 3-101520 | 4/1991 | (JP) . |
| 3-82934 | 8/1991 | (JP) . |
| 4-233841 | 8/1992 | (JP) . |
| 5-501340 | 3/1993 | (JP) . |
| 5-219000 | 8/1993 | (JP) . |
| 7-183803 | 7/1995 | (JP) . |
| 7-202874 | 8/1995 | (JP) . |
| 9-246960 | 9/1997 | (JP) . |

OTHER PUBLICATIONS

Charles R. Hogge, Jr., "A Self Correcting Clock Recovery Circuit", IEEE Trans. of Electron Devices, vol. ED–32, No. 12, pp. 2704–2706, Dec. 1985.
Chin–Kong Ken et al., "A 0.8–μm CMOS 2.5Gb/s Oversampling Receiver and Transmitter for Serial Links", IEEE Journal of Solid State Circuits, vol. 31, No. 12, pp. 2015–2023, Dec. 1996.

* cited by examiner

*Primary Examiner*—Stephen Chin
*Assistant Examiner*—Chieh M. Fan
(74) *Attorney, Agent, or Firm*—Sughrue, Mion, Zinn, Macpeak & Seas, PLLC

(57) ABSTRACT

In a phase comparator, a first data fetching circuit fetches an input signal in response to a transition timing of a clock signal having a frequency about half that of the input signal, and a second data fetching circuit fetches the output signal of the first data fetching circuit in response to a transition timing of an inverted signal of the clock signal. A first exclusive OR performs an exclusive OR operation upon the input signal and the output signal of the first data fetching circuit. and a second exclusive OR circuit performs an exclusive OR operation upon the output signals of the first and second data fetching circuits. An inverter inverts the output signal of the first exclusive OR circuit. A first AND circuit performs an AND operation upon the output signal of the second data fetching circuit and the output of the exclusive OR circuit, a second AND circuit performs an AND operation upon the output signal of the first exclusive OR circuit and the output of the first AND circuit to generate a leading signal, and a third AND circuit performs an AND operation upon the output signal of the inverter and the output of the,first AND circuit to generate a lagging signal.

6 Claims, 7 Drawing Sheets

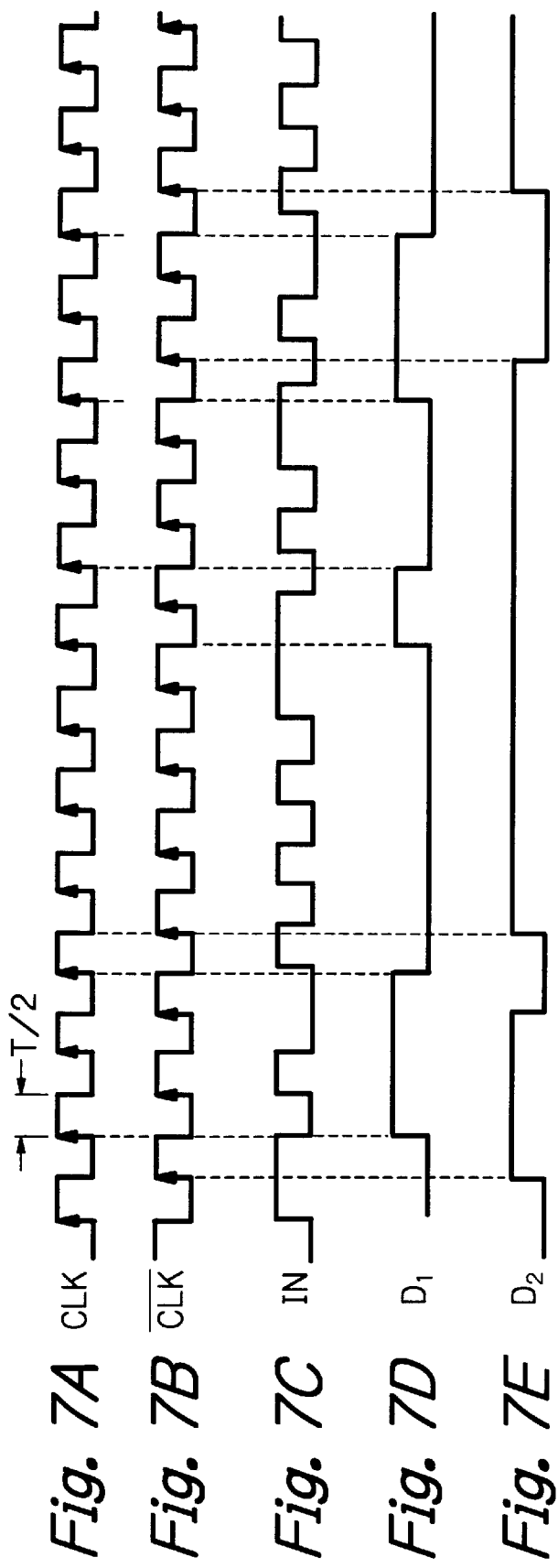

PHASE COMPARATOR OPERABLE AT HALF FREQUENCY OF INPUT SIGNAL

BACKGROUND OF THE INVENTION

1. Field of the Invention

The present invention relates to a phase comparator for use in a digital phase locked loop (PLL) circuit.

2. Description of the Related Art

In a serial communication system, in order to surely receive a serial input signal, synchronization between the serial input signal and a clock signal has to be established in a receiver circuit.

Generally, a digital serial input signal such as a Non Return to Zero (NRZ) signal latently includes a clock signal component which is produced when transmitting the digital serial signal. Therefore, the above-mentioned clock signal is recovered by a PLL circuit using the serial input signal.

A PLL circuit is usually constructed by a phase comparator for comparing the phase of an input signal with the phase of a clock signal, a loop filter for generating a control voltage in accordance with the output signal of the phase comparator, and a voltage controlled oscillator for controlling the frequency of the clock signal in accordance with the control voltage.

In a first prior art PLL circuit for recovery of a clock signal from a serial signal, the frequency of a clock signal is about the same as that of the NRZ signal (see: Charles R. Hodge, Jr., "A Self Correcting Clock Recovery Circuit", IEEE Transactions on Elecron Devices, Vol. ED-32, No. 12, pp. 2704–2706, December 1985). This will be explained later in detail.

In the above-described first prior art PLL circuit, in order to increase the amount of transmitted data in a serial communication system, the transmission speed of data needs to be increased, which also increases the frequency of the clock signal. However, if the frequency of the clock signal is increased, the performance of a semiconductor device for transmitter/receiver circuits, particularly, the PLL circuit thereof has to be improved. This increases the manufacturing cost.

In a second prior art PLL circuit for recovery of a clock signal from a serial signal, multiple phased clock signals each having a smaller frequency than that of the serial signal are adopted. Therefore, the speed of transmitted data can be increased without the necessity of improving the semiconductor device for the PLL circuit (see: Chik.Kong Ken Yang et al., "A 0.8μm CMOS 2.5 Gb/s Oversampling Receiver and Transmitter for Serial Links", IEEE Journal of Solid-State Circuits, Vol. 31, No. 12, December 1996).

In the above-mentioned prior art PLL circuit, however, if the number of the multiple phased clock signals is increased, it is difficult to accurately control the multiple phased clock signals, and also, a circuit configuration for the multiple phased clock signals is increased in size, which further increases the power dissipation.

SUMMARY OF THE INVENTION

It is an object of the present invention to provide a PILL circuit, particularly, a phase comparator thereof capable of decreasing the size and the power dissipation thereof without the necessity of improving the performance of a semiconductor device therefor.

According to the present invention, in a phase comparator, a first data fetching circuit fetches an input signal in response to a transition timing of a clock signal having a frequency about half that of the input signal, and a second data fetching circuit fetches the output signal of the first data fetching circuit in response to a transition timing of an inverted signal of the clock signal. A first exclusive OR performs an exclusive OR operation upon the input signal and the output signal of the first data fetching circuit, and a second exclusive OR circuit performs an exclusive OR operation upon the output signals of the first and second data fetching circuits. An inverter inverts the output signal of the first exclusive OR circuit. A first AND circuit performs an AND operation upon the output signal of the second data fetching circuit and the output of the exclusive OR circuit, a second AND circuit performs an AND operation upon the output signal of the first exclusive OR circuit and the output of the first AND circuit to generate a leading signal, and a third AND circuit performs an AND operation upon the output signal of the inverter and the output of the first AND circuit to generate a lagging signal.

Thus, since the frequency of the clock signal is decreased, it is unnecessary to improve the performance of a semiconductor device for a PILL circuit.

BRIEF DESCRIPTION OF THE DRAWINGS

The present invention will be more clearly understood from the description as set below, as compared with the prior art, with reference to the accompanying drawings, wherein:

FIGS. 7A through 7E are timing diagrams showing the operation of the 1 bit to 2 bit converter of FIG. 6;

DESCRIPTION OF THE PREFERRED EMBODIMENTS

Before the description of the preferred embodiment, a prior art PLL circuit will be explained with reference to FIGS. 1, 2 and 3A through 3G.

Figure 1:
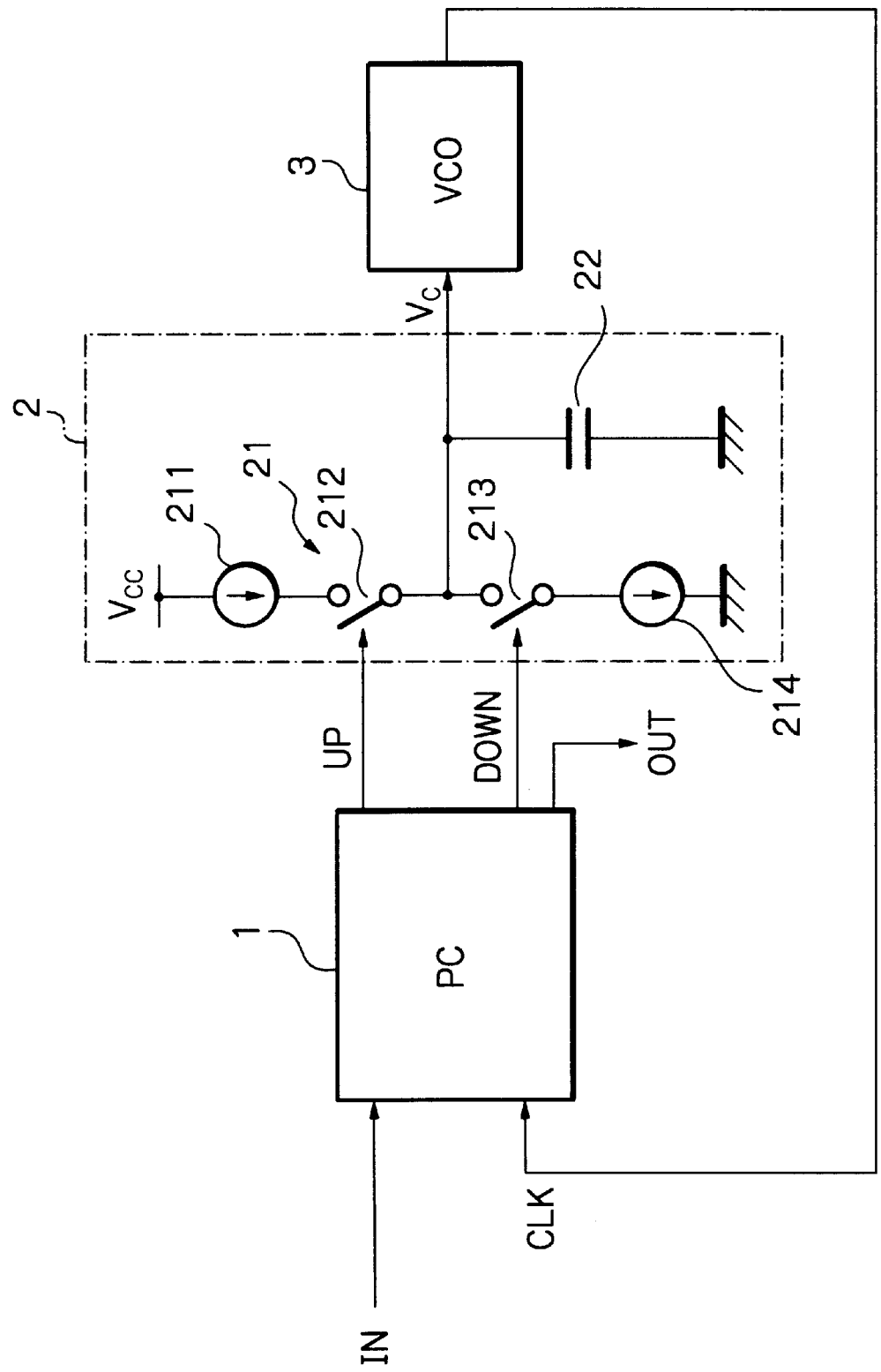
FIG. 1 is a block circuit diagram illustrating a prior art PLL circuit.

In FIG. 1, which illustrates a prior art PLL circuit, a PLL circuit is constructed by a phase comparator 1, a loop filter 2, and a voltage controlled oscillator 3.

The phase comparator 1 compares the phase of an input signal IN with that of a clock signal CLK output from the voltage controlled oscillator 3 to generate a leading signal UP and a lagging signal DOWN.

The loop filter 2 is formed by a charge pump circuit 21 and a capacitor 22 charged and discharged by the charge pump circuit 21. The charge pump circuit 21 includes a current source 211, a switch 212 turned ON by the leading signal UP, a switch 213 turned ON by the lagging signal DOWN, and a current source 214. That is, when the switch 212 is turned ON, the capacitor 22 is charged by the current source 211 to increase a control voltage $V_c$. On the other hand, when the switch 213 is turned ON, the capacitor 22 is discharged by the current source 214 to decrease the control voltage $V_c$.

The oscillation frequency of the voltage controlled oscillator 3 is controlled by the control voltage $V_c$.

Figure 2:
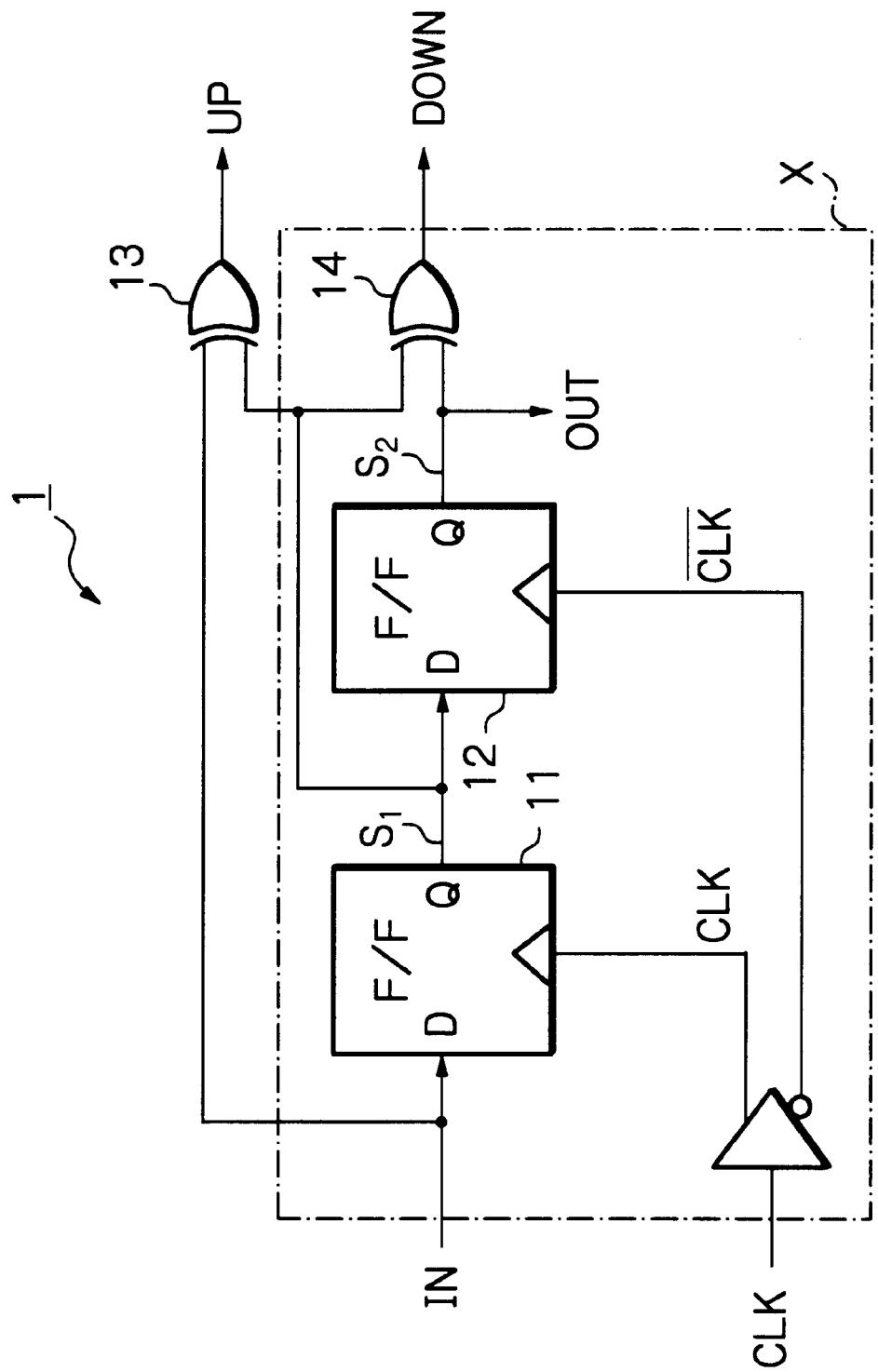
FIG. 2 is a detailed circuit diagram of the phase comparator of FIG. 1.
Figure 3:
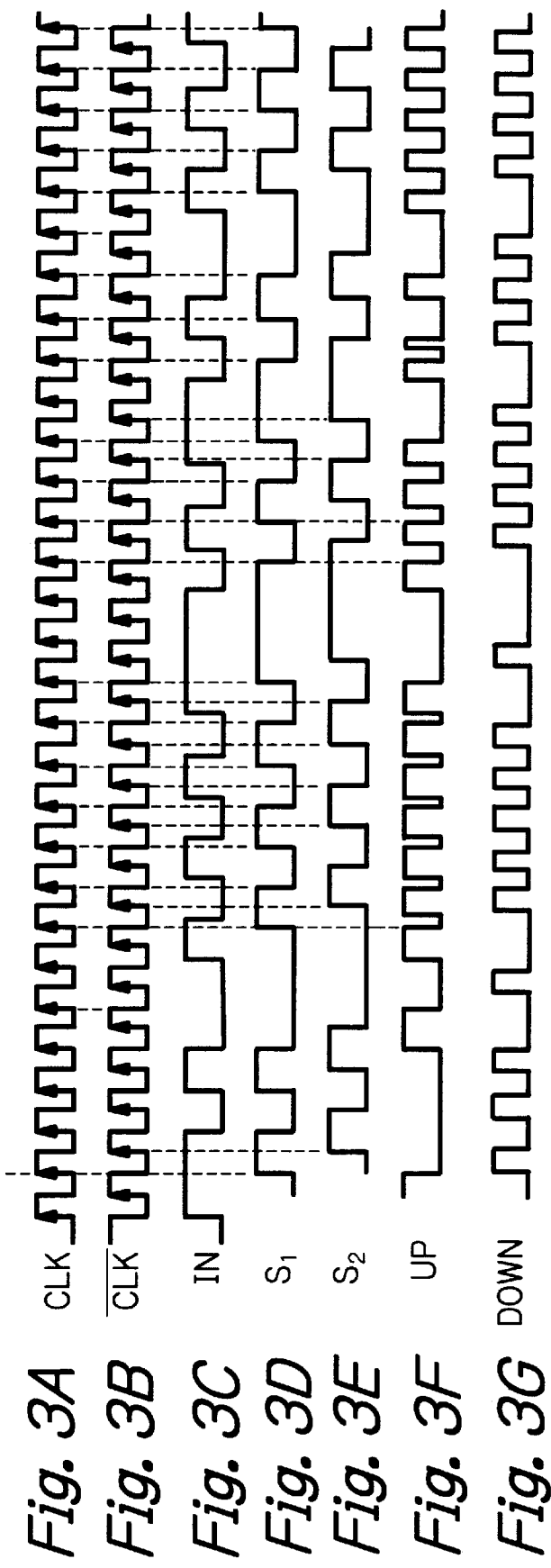
FIGS. 3A through 3G are timing diagrams for explaining the operation of the comparator of FIG. 2.

In FIG. 2, which is a detailed circuit diagram of the phase comparator 1 of FIG. 1 (see: Charles R. Hodge, Jr., "A Self Correcting Clock Recovery Circuit," IEEE Transactions on Electron Devices, Vol. ED-32, No. 12, pp. 2704–2706, December 1985), if an input signal IN is an NRZ signal as shown in FIG. 3C, a clock signal CLK has about the same frequency as that of the NRZ signal. A D-type flip-flop 11 fetches the input signal IN in response to a rising edge of the clock signal CLK as shown in FIG. 3A, and a D-type flip-flop 12 fetches the output signal $S_1$ of the D-type flip-flop 11 in response to a falling edge of the clock signal CLK, i.e., a rising edge of an inverted signal of the clock signal CLK as shown in FIG. 3B. The input signal IN and the output signal SI of the D-type flip-flop 11 are supplied to an exclusive OR circuit 13 that generates a leading signal UP as shown in FIG. 3F. Also, the output signal $S_1$ of the D-type flip flop 11 and the output signal $S_2$ of the D-type flip-flop 12 are supplied to an exclusive OR circuit 14 that generates a lagging signal DOWN as shown in FIG. 3G. Note that the output signal $S_2$ of the D-type flip-flop 12 serves as an output data OUT.

In FIG. 2, note that, a portion indicated by X forms a rising and falling transition detection circuit, and the exclusive OR circuit 13 forms a phase difference determination circuit.

As shown in FIGS. 3F and 3G, the width of pulses of the leading signal UP is variable, while the width of pulses of the lagging signal DOWN is fixed. The larger the width of pulses of the leading signal UP with respect to the width of pulses of the lagging signal DOWN, the higher the control voltage $V_c$. On the other hand, the smaller the width of pulses of the leading signal UP with respect to the width of pulses of the lagging signal DOWN, the lower the control voltage $V_c$.

In a serial data communication system, in order to increase the amount of transmitted data, the transmission speed needs to be increased, which also increases the frequency of the clock signal CLX. However, if the clock signal CLX is increased, the performance of an integrated semiconductor circuit device for transmitter/receiver circuits, particularly, for a PILL circuit has to be improved, which increases the manufacturing cost.

Figure 4:
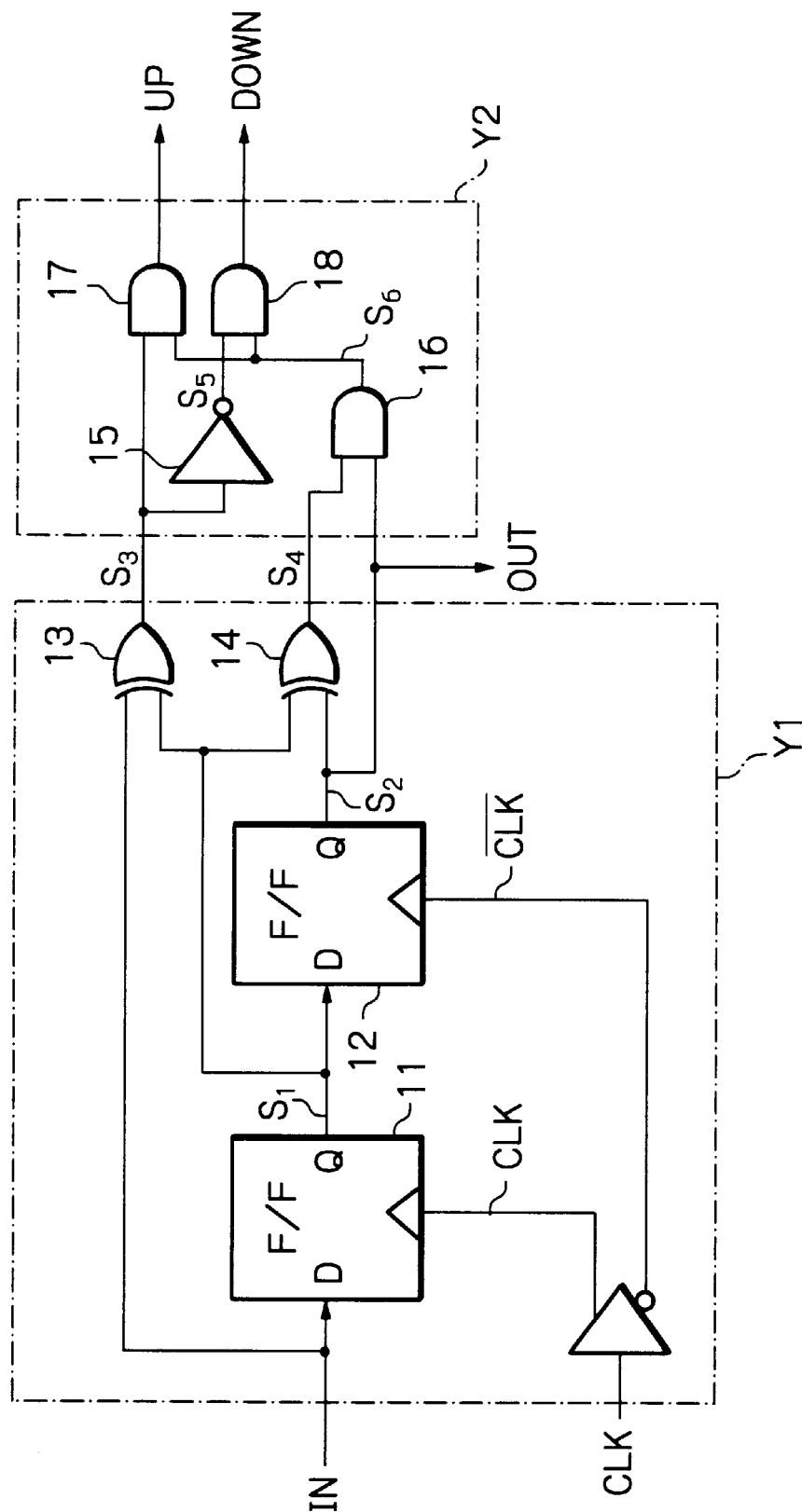
FIG. 4 is a circuit diagram illustrating an embodiment of the phase comparator according to the present invention.

In FIG. 4, which illustrates an embodiment of the present invention, in a phase comparator 1', an inverter 15, and AND circuits 16–18 forming a phase difference determination circuit Y2 is added to the circuit of FIG. 2 forming a falling transition detection circuit. Note that the phase comparator 1' of FIG. 4 is used instead of the phase comparator 1 in FIG. 1.

That is, the inverter 15 inverts the output signal $S_3$ of the exclusive OR circuit 13 to generate an output signal $S_3$. The AND circuit 16 performs an AND operation upon the output signal $S_2$ of the D-type flip-flop 12 and the output signal $S_4$ of the exclusive OR circuit 14 to generate an output signal $S_6$. The AND circuit 17 performs an AND operation upon the output signal $S_3$ of the exclusive OR circuit 13 and the output signal $S_6$ of the and circuit 16 to generate a leading signal UP. The AND circuit 18 performs an AND operation upon the output signal $S_5$ of the inverter 15 and the output $S_6$ of the AND circuit 16 to generate a lagging signal DOWN.

In FIG. 4, note that the clock signal CLK of the voltage controlled oscillator 3 (see FIG. 1) has about half of the frequency of the input signal IN.

The operation of the phase comparator 1' of FIG. 4 is explained next with reference to FIGS. 5A through 5K.

Figure 5:
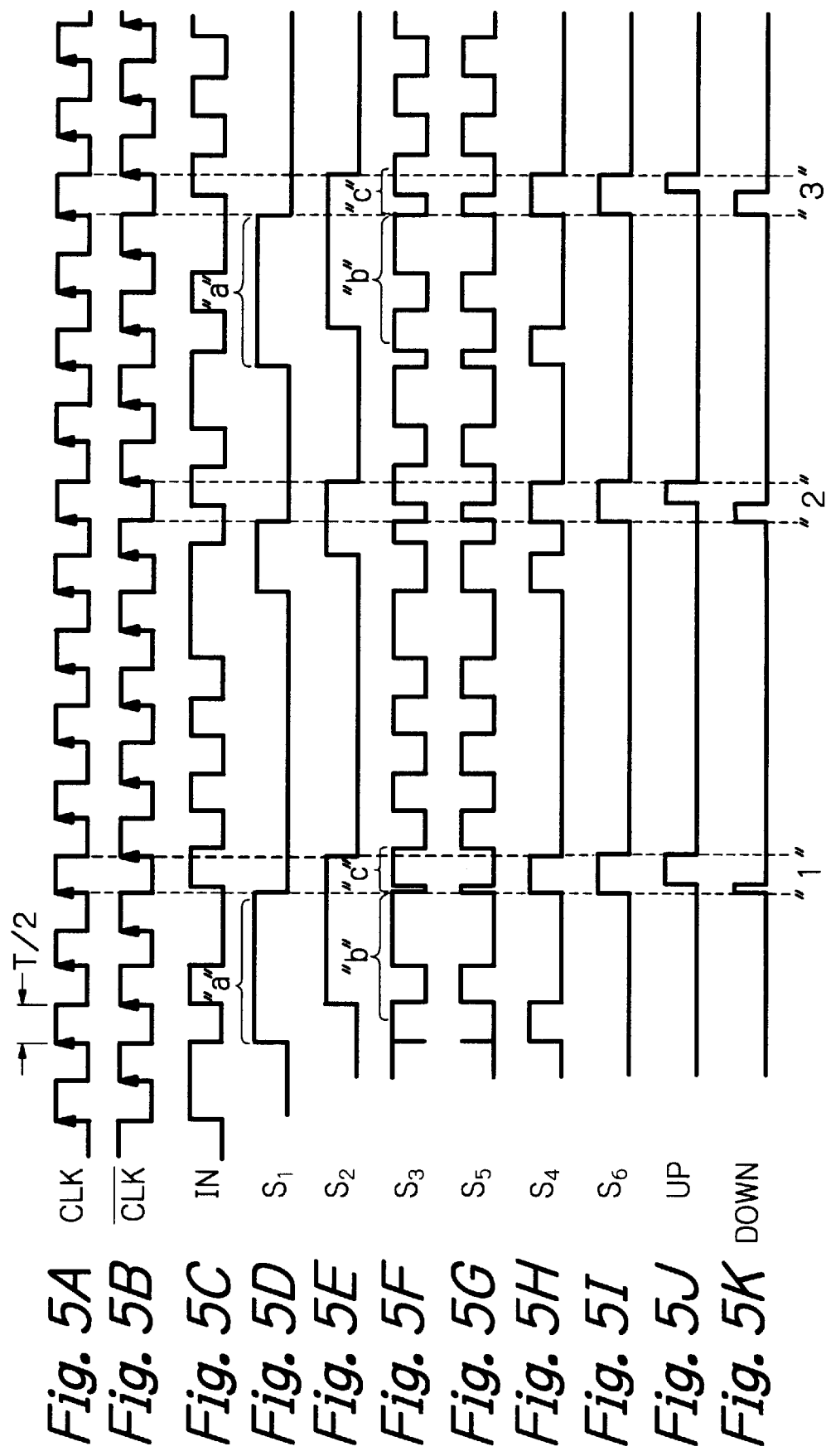
FIGS. 5A through 5K are timing diagrams showing the operation of the phase comparator of FIG. 4.

The D-type flip-flop 11 fetches the input signal IN as shown in FIG. 5C in response to rising edges of the clock signal CLK as shown in FIG. 5A. In this case, the output signal $S_1$ of the D-type flip-flop 11 is not an NRZ signal, since the frequency of the clock signal CLK is about half of that of the input signal IN.

The D-type flip-flop 12 fetches the output signal $S_1$ of the D-type flip-flop 11 as shown in FIG. 5D in response to rising edges of an inverted signal of the clock signal CLK as shown in FIG. 5B. That is, as shown in FIGS. 5D and 5E, the output signal $S_2$ of the D-type flip-flop 12 is delayed By half of one period T/2 of the clock signal CLK from the output signal $S_1$ of the D-type flip-flop 11. Note that the output signal $S_2$ of the D-type flip-flop 12 is output as an output signal OUT.

As shown in FIGS. 5A. 5C and 5F, the output signal $S_3$ of the exclusive OR circuit 13 includes information on phase error between the input signal IN and the clock signal CLK.

As shown in FIGS. 5D and 5H, the output signal $S_4$ of the exclusive OR circuit 14 shows rising and falling transitions of the output signal $S_1$ of the D-type flip-flop 11.

As shown in FIGS. 5D and 5I, the output signal $S_6$ of the AND circuit 16 shows falling transitions of the output signal $S_1$ of the D-type flip-flop 11.

As shown in FIGS. 5F, 5I and 5J, the AND circuit 17 performs an AND operation upon the output signal $S_3$ of the exclusive OR circuit 13 with the output signal $S_6$ of the AND circuit 16, to generate the leading signal UP. That is, only a phase error component is taken out of the output signal $S_3$ of the exclusive OR circuit 13.

As shown in FIGS. 5G, 5I and 5K, the AND circuit 18 performs an AND operation upon the output signal $S_5$ of the inverter 15 with the output signal $S_6$ of the AND circuit 16, to generate the lagging signal DOWN. In more detail, a period "a" of the signal $S_1$ in FIG. 5D consists of an input signal component as indicated by "b" and a phase error component as indicated by "c" in FIG. 5F. Note that this phase error component "c" exists only in falling transition periods of the output signal $S_1$ of the D-type flip-flop 11. Therefore, such falling transitions are generated by the output signal $S_6$ of the AND circuit 16 of FIG. 5I.

Also, as indicated by "1" and "2" in FIGS. 5J and 5K, the pulse width of the leading signal UP is different from that of the lagging signal DOWN. In this case, if jitter occurs in the clock signal CLK, correct data is hardly fetched.

On the other hand, as indicated by "3" in FIGS. 5J and 5K, the pulse width of the leading signal UP is the same as that of the lagging signal DON. In this case, even if jitter occurs in the clock signal CLX, correct data can be fetched, because the input signal IN synchronizes with the clock signal CLK, so that the clock signal CLK transits at centers of NRZ data. Therefore, the NRZ signal can be surely recognized.

Thus, in the phase comparator 1' of FIG. 4, even when one of the input signals is an NRZ signal and the other is a clock signal having about half the frequency of the NRZ signal, a phase comparison therebetween is possible. Therefore, if a PILL circuit of FIG. 1 is constructed by using the phase comparator 1' of FIG. 4, a clock signal in synchronization with an input signal can be extracted from the PLL circuit.

Figure 6:
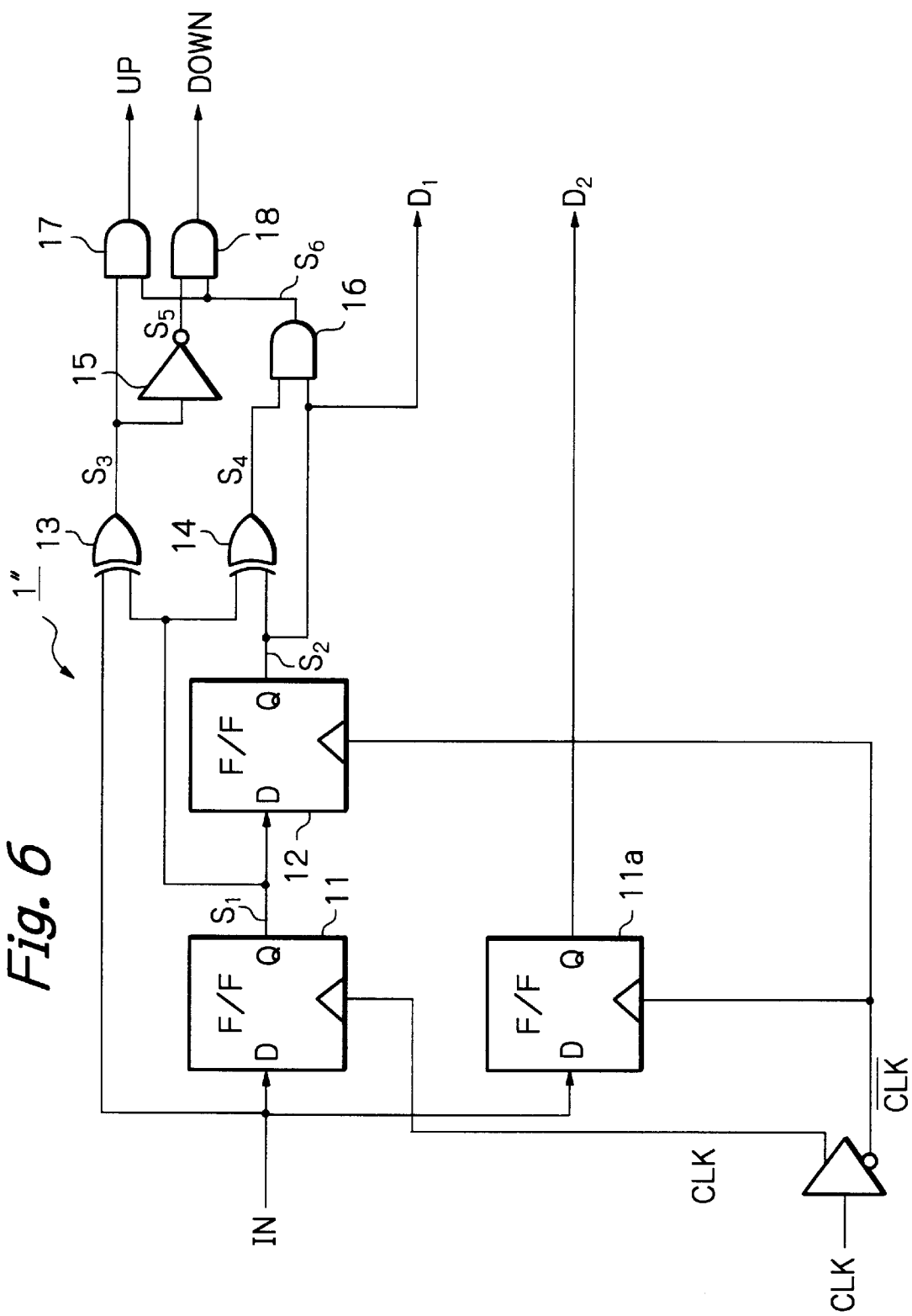
FIG. 6 is a circuit diagram of a 1 bit to 2 bit converter to which the phase comparator of FIG. 4 is applied.

FIG. 6 illustrates a 1 bit to 2 bit converter to which the phase comparator of FIG. 4 is applied. That is, a D-tipe flip-flop 11a is added to the elements of FIG. 4. Note that a phase comparator 1" of FIG. 6 is used instead of the phase comparator 1 in FIG. 1.

In FIG. 6, the D-type flip-flop 1ha fetches the input signal IN (which is a serial data signal) in response to falling edges of the clock signal CLK as shown in FIG. 7A, i.e., rising edges of an inverted signal of the clock signal CLK as show in FIG. 7B. That is, the clock timing of the D-type flip-flop 11 is shifted from that of the D-type flip-flop 11a by a half period (T/2) of the clock signal CLK. The output signal of the D-type flip-flop 12 and the output signal of the D-type flip-flop 11a constitute two parallel data bits $D_1$ and $D_2$, respectively.

The D-type flip-flops 11, 12 and 11a form a data retention circuit. A plurality of data retention circuits, each of which comprises the D-type flip-flops 11, 12 and 11a, have different phases relative to each other.

Thus, the serial input signal In as shown in FIG. 7C is converted into the two parallel output signals $D_1$ and $D_2$ as shown in FIGS. 7D and 7E, respectively.

As explained hereinabove, a phase comparator according to the present invention can surely compare an input signal with a clock signal whose frequency is about half that of the input signal. Therefore, it is unnecessary to improve the performance of a semiconductor device for a PLL circuit including the phase comparator, which also decreases the size and power dissipation thereof.

What is claimed is:

1. A phase comparator comprising:

a first data fetching circuit for fetching an input signal in response to a transition timing of a clock signal having a frequency about half that of said input signal;

a second data fetching circuit, connected to said first data fetching circuit, for fetching an output signal of said first data fetching circuit in response to a transition timing of an inverted signal of said clock signal;

a first exclusive OR circuit, connected to said first data fetching circuit, for performing an exclusive OR operation upon said input signal and the output signal of said first data fetching circuit;

a second exclusive OR circuit, connected to said first and second data fetching circuits, for performing an exclusive OR operation upon the output signal of said first data fetching circuit and an output signal of said second data fetching circuit;

an inverter, connected to said first exclusive OR circuit, for inverting an output signal of said first exclusive OR circuit;

a first AND circuit, connected to said second data fetching circuit and said second exclusive OR circuit, for performing an AND operation upon the output signal of said second data fetching circuit and an output of said exclusive OR circuit;

a second AND circuit, connected to said first exclusive OR circuit and said first AND circuit, for performing an AND operation upon the output signal of said first exclusive OR circuit and an output of said first AND circuit to generate a leading signal; and a third AND circuit, connected to said inverter and said first AND circuit, for performing an AND operation upon the output signal of said inverter and The output of said first AND circuit to generate a lagging signal.

2. The phase comparator as set forth in claim 1, wherein each of said first and second data fetching circuits comprises a D-type flip-flop.

3. A phase-locked loop circuit comprising:

a phase comparator for comparing a phase of an input signal with a phase of a clock signal which has a frequency about half a frequency of said input signal to generate a leading signal and a lagging signal;

a loop filter, connected to said phase comparator, for increasing a control voltage in accordance with said leading signal and decreasing said control voltage in accordance with said lagging signal; and a voltage controlled oscillator, connected between said loop filter and said phase comparator, for controlling a frequency of said clock signal in accordance with said control voltage, said phase comparator comprising:

a first data fetching circuit for fetching said input signal in response to a transition timing of said clock signal;

a second data fetching circuit, connected to said first data fetching circuit, for fetching an output signal of said first data fetching circuit in response to a transition timing of an inverted signal of said clock signal;

a first exclusive OR circuit, connected to said first data fetching circuit, for performing an exclusive OR operation upon said input signal and the output signal of said first data fetching circuit;

a second exclusive OR circuit, connected to said first and second data fetching circuits, for performing an exclusive OR operation upon the output signal of said first data fetching circuit and an output signal of said second data fetching circuit;

an inverter, connected to said first exclusive OR circuit, for inverting an output signal of said first exclusive OR circuit;

a first AND circuit, connected to said second data fetching circuit and said second exclusive OR circuit, for performing an AND operation upon the output signal of said second data fetching circuit and an output of said exclusive OR circuit;

a second AND circuit, connected to said first exclusive OR circuit and said first AND circuit, for performing an AND operation upon the output signal of said first exclusive OR circuit and an output of said first AND circuit to generate said leading signal; and a third AND circuit, connected to said inverter and said first AND circuit, for performing an AND operation upon the output signal of said inverter and the output of said first AND circuit to generate said lagging signal.

4. The phase comparator as set forth in claim 3, wherein each of said first and second data fetching circuits comprises a Dtype flip-flop.

5. A serial-to-parallel converter comprising a plurality of data retention circuits each including a first data fetching circuit for fetching an serial input signal in response to a transition timing of a clock signal which has a frequency about half that of said serial input signal, a second data fetching circuit for fetching an output signal of said first data fetching circuit in response to a transition timing of an inverted signal of said clock signal to generate an output signal, and a third data fetching circuit for fetching said serial input signal in response to a transition timing of the inverted signal of said clock signal to generate another output signal, said clock signal of each of said data retention circuits being different from each other in phase, said serial-to-parallel converter further comprising:

a phase comparator for comparing a phase of said serial input signal with a phase of said clock signal to generate a leading signal and a lagging signal;

a loop filter, connected to said phase comparator, for increasing a control voltage in accordance with said leading, signal and decreasing said control voltage in accordance with said lagging signal; and a voltage controlled oscillator, connected between said loop filter and said phase comparator, for controlling a frequency of said clock signal in accordance with said control voltage, said phase comparator comprising:

said first and second data fetching circuits of one of said data retention circuit;

a first exclusive OR circuit, connected to said first data fetching circuit, for performing an exclusive OR operation upon said input signal and the output signal of said first data fetching circuit of said one of said data retention circuits;

a second exclusive OR circuit, connected to said first and second data fetching circuits of said one of said data retention circuits, for performing an exclusive OR operation upon the output signals of said first and second data fetching circuits of said one of said data retention circuits;

an inverter, connected to said first exclusive OR circuit, for inverting an output signal of said first exclusive OR circuit;

a first AND circuit, connected to said second data fetcing circuit of said one of said data retention circuits and said second exclusive OR circuit, for performing an AND operation upon the output signal of said second data fetching circuit of said one of said data retention circuits and an output of said exclusive OR circuit;

a second AND circuit, connected to said first exclusive OR circuit and said first AND circuit, for performing an AND operation upon the output signal of said first exclusive OR circuit and an output of said first AND circuit to generate said leading signal; and a third AND circuit, connected to said inverter and said first AND circuit, for performing an AND operation upon the output signal of said inverter and the output of said first AND circuit to generate said lagging signal.

6. The phase comparator as set forth in claim 5, wherein each of said first, second and third data fetching circuits comprises a D-type flip-flop.

\* \* \* \* \*

UNITED STATES PATENT AND TRADEMARK OFFICE
CERTIFICATE OF CORRECTION

PATENT NO. : 6,314,151 B1
DATED : November 6, 2001
INVENTOR(S) : Muneo Fukaishi

Page 1 of 1

It is certified that error appears in the above-identified patent and that said Letters Patent is hereby corrected as shown below:

Column 1,
Line 61, delete "PILL" insert -- PLL --

Column 2,
Line 22, delete "PILL" insert -- PLL --

Column 3,
Line 44, delete "PILL" insert -- PLL --

Signed and Sealed this

Thirtieth Day of April, 2002

Attest:

JAMES E. ROGAN
*Director of the United States Patent and Trademark Office*

*Attesting Officer*